United States Patent
Hirai et al.

(10) Patent No.: US 11,266,039 B2
(45) Date of Patent: Mar. 1, 2022

(54) LIQUID IMMERSION TANK

(71) Applicant: FUJITSU LIMITED, Kawasaki (JP)

(72) Inventors: Keita Hirai, Kawasaki (JP); Masayuki Watanabe, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 233 days.

(21) Appl. No.: 16/424,689

(22) Filed: May 29, 2019

(65) Prior Publication Data

US 2019/0380228 A1    Dec. 12, 2019

(30) Foreign Application Priority Data

Jun. 7, 2018   (JP) .............................. JP2018-109173

(51) Int. Cl.
*H05K 7/20*   (2006.01)
*F28F 27/00*   (2006.01)

(52) U.S. Cl.
CPC ......... *H05K 7/20281* (2013.01); *F28F 27/00* (2013.01); *H05K 7/20236* (2013.01); *H05K 7/20272* (2013.01)

(58) Field of Classification Search
CPC ........... H05K 7/20236; H05K 7/20272; H05K 7/20281; H05K 7/203; H05K 7/20327; H05K 7/20345; H01L 23/4338; H01L 23/44; H01L 23/473; F28D 3/04; F28D 2021/0028; F28F 9/0263; F28F 9/027; F28F 9/0275; F28F 2009/029; F28F 2025/005; F28F 25/02; F28F 25/04; F28F 27/00; F28F 27/02; G06F 2200/201; G06F 1/20; H01B 7/423; H01B 27/10–18

See application file for complete search history.

(56) References Cited

U.S. PATENT DOCUMENTS

| | | | | |
|---|---|---|---|---|
| 1,502,573 | A | * | 7/1924 | Kuhn .................... B01D 53/185 239/553 |
| 1,871,449 | A | * | 8/1932 | Eschholz ................ H01F 27/14 174/14 R |
| 2,606,750 | A | * | 8/1952 | Jacir ......................... F28C 1/02 261/30 |
| 2,658,737 | A | * | 11/1953 | Nutter .................... B01D 3/163 261/114.4 |

(Continued)

FOREIGN PATENT DOCUMENTS

| | | |
|---|---|---|
| JP | 63-120449 | 5/1988 |
| JP | 2002-505033 | 2/2002 |

(Continued)

*Primary Examiner* — Jianying C Atkisson
*Assistant Examiner* — Jose O Class-Quinones
(74) *Attorney, Agent, or Firm* — Fujitsu Patent Center (57) ABSTRACT

A liquid immersion tank includes a housing configured to house a heat generator, a gutter provided over the housing, and configured to form a flow path through which a coolant flows, a flow rate adjuster provided at an outflow port through which the coolant flows out from the flow path, and configured to adjust an outflow amount of the coolant, a slope provided over the housing, and configured to include a down-flow surface through which the coolant branched from the flow path flows down toward the housing, the coolant flowing through the flow rate adjuster, and a tank configured to accommodate the housing.

8 Claims, 12 Drawing Sheets

(56) References Cited

U.S. PATENT DOCUMENTS

| | | | | |
|---|---|---|---|---|
| 2,845,472 | A * | 7/1958 | Narbut | H01F 27/18 |
| | | | | 174/15.1 |
| 2,849,523 | A * | 8/1958 | Narbut | H01F 27/18 |
| | | | | 174/15.1 |
| 2,875,263 | A * | 2/1959 | Narbutovskih | F28D 15/0266 |
| | | | | 174/15.1 |
| 2,924,635 | A * | 2/1960 | Narbut | H01B 3/24 |
| | | | | 174/15.1 |
| 3,290,025 | A * | 12/1966 | Engalitcheff, Jr. | F28D 5/02 |
| | | | | 261/140.1 |
| 3,301,401 | A * | 1/1967 | Hall | C02F 3/103 |
| | | | | 210/150 |
| 3,315,896 | A * | 4/1967 | Jacir | F28F 25/04 |
| | | | | 239/193 |
| 3,370,454 | A * | 2/1968 | Flores | G01K 15/00 |
| | | | | 374/3 |
| 3,406,244 | A * | 10/1968 | Oktay | H01J 7/24 |
| | | | | 174/15.1 |
| 3,659,623 | A * | 5/1972 | Facius | F28C 1/02 |
| | | | | 137/255 |
| 4,009,229 | A * | 2/1977 | Szucs | F28C 1/04 |
| | | | | 261/72.1 |
| 4,149,134 | A * | 4/1979 | Kothmann | H05K 7/20345 |
| | | | | 336/57 |
| 4,201,262 | A * | 5/1980 | Goldstein | F28D 3/04 |
| | | | | 165/117 |
| 4,302,793 | A * | 11/1981 | Rohner | H05K 7/20272 |
| | | | | 174/15.1 |
| 4,467,305 | A * | 8/1984 | Ando | H01F 27/18 |
| | | | | 174/14 R |
| 4,557,877 | A * | 12/1985 | Hofstetter | B01D 3/008 |
| | | | | 239/450 |
| 4,562,702 | A * | 1/1986 | Endo | H01F 27/18 |
| | | | | 165/104.21 |
| 5,324,886 | A * | 6/1994 | Nakatake | H01F 27/321 |
| | | | | 174/12 R |
| 5,943,211 | A * | 8/1999 | Havey | H01L 25/105 |
| | | | | 361/699 |
| 6,105,663 | A * | 8/2000 | Usui | F28C 1/14 |
| | | | | 165/115 |
| 6,138,698 | A * | 10/2000 | Tanaka | B08B 3/12 |
| | | | | 134/184 |
| 6,205,799 | B1 * | 3/2001 | Patel | F25B 39/04 |
| | | | | 165/104.33 |
| 8,196,908 | B2 * | 6/2012 | Lee | F28C 1/02 |
| | | | | 261/133 |
| 8,913,383 | B1 * | 12/2014 | Goldsmith | H05K 9/0049 |
| | | | | 361/679.53 |
| 9,335,802 | B2 * | 5/2016 | Shelnutt | H05K 7/203 |
| 2014/0367872 | A1 * | 12/2014 | Hicks | B01F 3/04049 |
| | | | | 261/128 |
| 2017/0142868 | A1 * | 5/2017 | Chen | F28D 15/0266 |
| 2017/0151511 | A1 * | 6/2017 | Lu | F28D 15/00 |
| 2017/0153061 | A1 * | 6/2017 | Yoshioka | F25B 39/02 |
| 2017/0156233 | A1 * | 6/2017 | Moss | H05K 7/20763 |
| 2017/0280577 | A1 * | 9/2017 | Laneryd | H01F 27/14 |
| 2017/0354061 | A1 * | 12/2017 | Saito | H05K 7/20236 |
| 2017/0363360 | A1 * | 12/2017 | Brenner | F28F 9/026 |
| 2018/0270987 | A1 * | 9/2018 | Yuan | H05K 7/209 |
| 2019/0043785 | A1 * | 2/2019 | Wang | H01L 23/4735 |
| 2019/0063843 | A1 * | 2/2019 | Steinbauer | F28F 25/02 |

FOREIGN PATENT DOCUMENTS

| | | | | |
|---|---|---|---|---|
| WO | | 97/43887 | 11/1997 | |
| WO | WO-2017215168 | A1 * | 12/2017 | H05K 7/2029 |

* cited by examiner

LIQUID IMMERSION TANK

CROSS-REFERENCE TO RELATED APPLICATION

This application is based upon and claims the benefit of the prior Japanese Patent Application No. 2018-109173 filed on Jun. 7, 2018, the entire contents of which are incorporated herein by reference.

FIELD

The embodiments discussed herein are related to a liquid immersion tank.

BACKGROUND

In the related art, various types of devices have been proposed to cool down electronic devices that generate heat. For example, a heat dissipation system configured to spray a liquid cooling refrigerant by a sprayer inside a housing including a heat-generating component is known (see, e.g., Japanese National Publication of International Patent Application No. 2002-505033). Further, an evaporative cooling device for an integrated circuit device is known that is provided with a shower mechanism for sprinkling a chemical refrigerant which has a low boiling point above a printed circuit board (see, e.g., Japanese Laid-open Patent Publication No. 63-120449).

SUMMARY

According to an aspect of the embodiments, a liquid immersion tank includes a housing configured to house a heat generator, a gutter provided over the housing, and configured to form a flow path through which a coolant flows, a flow rate adjuster provided at an outflow port through which the coolant flows out from the flow path, and configured to adjust an outflow amount of the coolant, a slope provided over the housing, and configured to include a down-flow surface through which the coolant branched from the flow path flows down toward the housing, the coolant flowing through the flow rate adjuster, and a tank configured to accommodate the housing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the above related art, the refrigerant is sprayed or sprinkled. Thus, the refrigerant is scattered even in an area where an object to be cooled does not exist. Further, it is difficult to supply the refrigerant according to the temperature of the object to be cooled. For example, even in a case where an object to be cooled that includes a high heat-generating component and an object to be cooled that includes a low heat-generating component coexist, it is difficult to adjust the spray amount for each object to be cooled.

Figure 1:
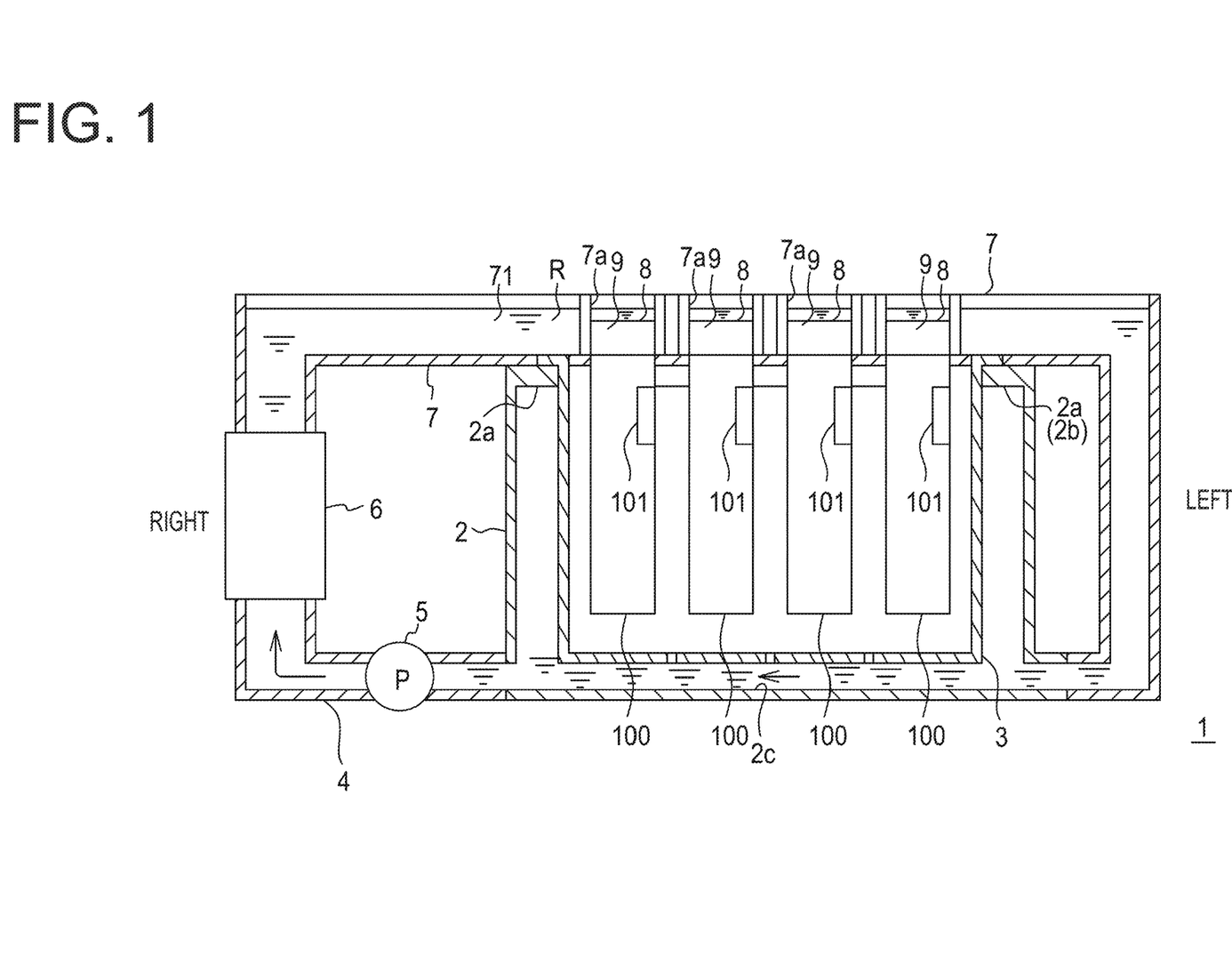
FIG. 1 is an explanatory view schematically illustrating a configuration of an liquid immersion tank of an embodiment.
Figure 2:
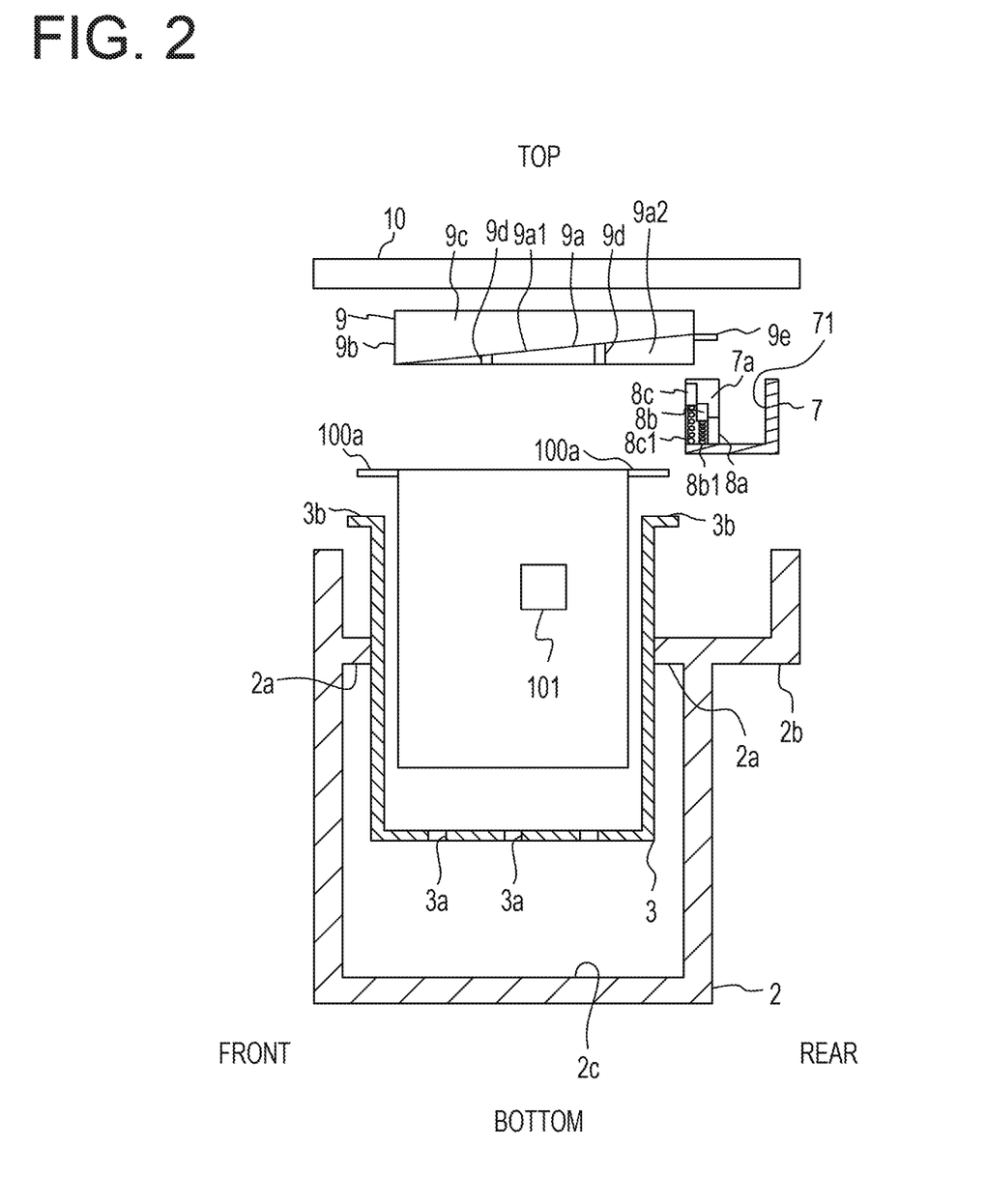
FIG. 2 is an explanatory view illustrating the liquid immersion tank of the embodiment in a dissembled state, and a cross section of a tank and a gutter member.
Figure 3:
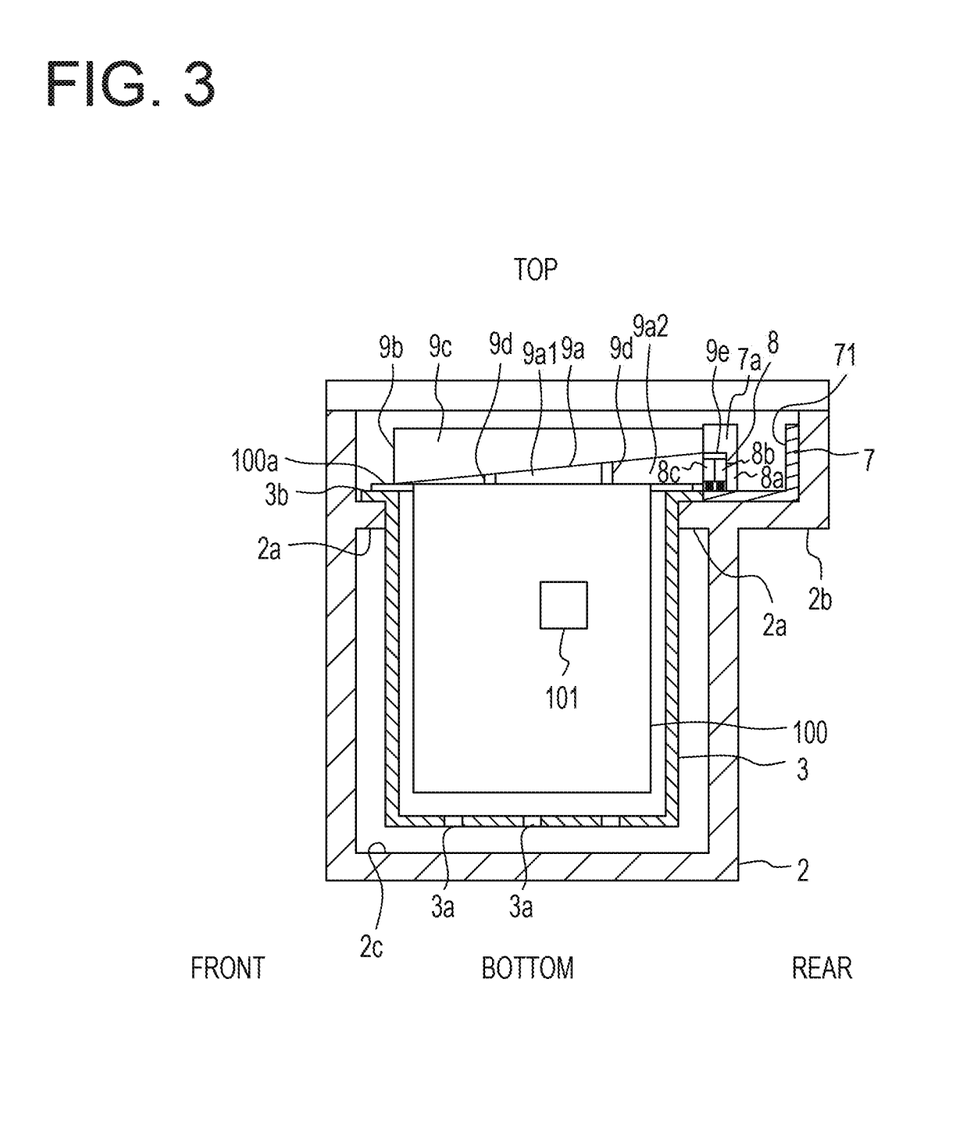
FIG. 3 is an explanatory view illustrating the cross section of the tank and gutter member of the liquid immersion tank of the embodiment.

Hereinafter, embodiments of a technique of the present disclosure for adjusting the amount of refrigerant according to the amount of heat generated by an object to be cooled will be described with reference to the accompanying drawings. However, in the drawings, the dimensions, proportions, or the like of the respective parts may not be illustrated so as to completely correspond to the actual ones. Also, in some drawings, for the convenience of explanation, actually existing components may be omitted, or dimensions thereof may be exaggerated. In descriptions below, it is assumed that the front, the rear, the top, and the bottom of a liquid immersion tank 1 are set as illustrated in FIG. 2 or FIG. 3. Further, it is assumed that the left-right direction of the liquid immersion tank 1 is set as illustrated in FIG. 1.

Referring to FIGS. 1 to 5, the liquid immersion tank 1 of the embodiment includes an outer tank 2 and an inner tank 3 that is housed in the outer tank 2. The outer tank 2 is provided with a flange-shaped first support portion 2a to support the inner tank 3. Further, the outer tank 2 is provided with a second support portion 2b on which a gutter member 7 to be described later is provided. A liquid refrigerant (coolant) R flows on a bottom portion 2c of the outer tank 2.

A communicating hole 3a is provided at the bottom of the inner tank 3. The refrigerant R may pass through the communicating hole 3a. A support flange 3b is provided at an upper edge of the inner tank 3. The inner tank 3 is installed in the outer tank 2 by supporting the support flange 3*b* on the first support portion 2*a* of the outer tank 2. A housing 100 that houses an electronic component 101 is accommodated in the inner tank 3. The electronic component 101 is an example of a heat-generating body (heat generator). The electronic component 101 is a component such as an integrated circuit device that generates heat when used. A support flange 100*a* is provided at an upper edge portion of the housing 100. The housing 100 is accommodated and installed in the outer tank 2 by supporting the support flange 100*a* together with the support flange 3*b* of the inner tank 3 on the first support portion 2*a*. The outer tank 2 and the inner tank 3 correspond to the tank, but the housing 100 may be provided in the outer tank 2 without providing the inner tank 3.

The outer tank 2 is connected with a circulation path 4 that circulates the refrigerant R flowing on the bottom portion 2C. A pump 5 and a heat exchanger 6 are provided on the circulation path 4. The circulation path 4 includes a flow path 71 formed by the gutter member 7. The gutter member 7 forms the flow path 71 through which the refrigerant flows. The gutter member 7 is an example of a first member (a gutter). The gutter member 7 is provided above the housing 100. Further, the gutter member 7 is provided on the rear side of the outer tank 2 so as to extend in the left-right direction. The pump 5 pumps up the refrigerant R to the height of the gutter member 7. The heat exchanger 6 cools the refrigerant R. The refrigerant R that is pumped up to the gutter member 7 by the pump 5 flows out to the housing 100 as described later in detail. The refrigerant R that flows out passes through the communication hole 3*a* of the inner tank 3 and is collected on the bottom portion 2*c* of the outer tank 2. Then, the collected refrigerant is sent back to the circulation process.

Figure 4:
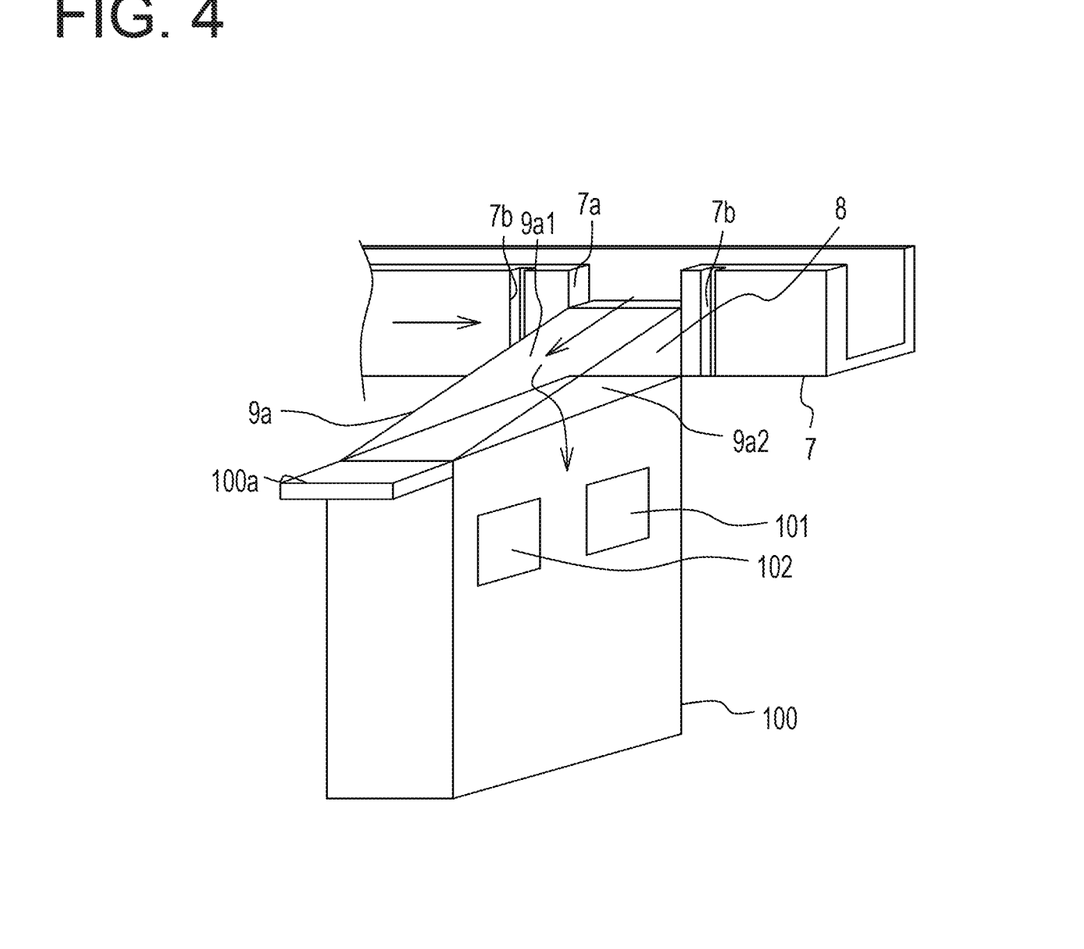
FIG. 4 is a perspective view illustrating a state where refrigerant flows down to a down-flow block provided in the liquid immersion tank of the embodiment.
Figure 5:
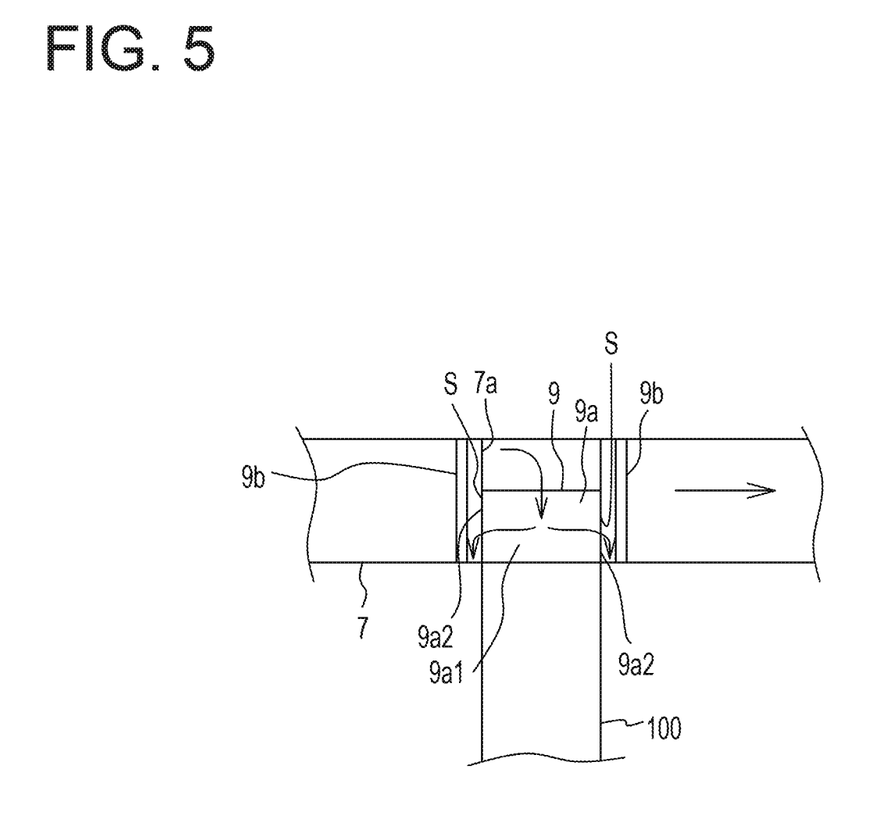
FIG. 5 is an explanatory view illustrating a state where refrigerant flows down to the down-flow block provided in the liquid immersion tank of the embodiment when viewed from the front side of the liquid immersion tank.
Figure 6:
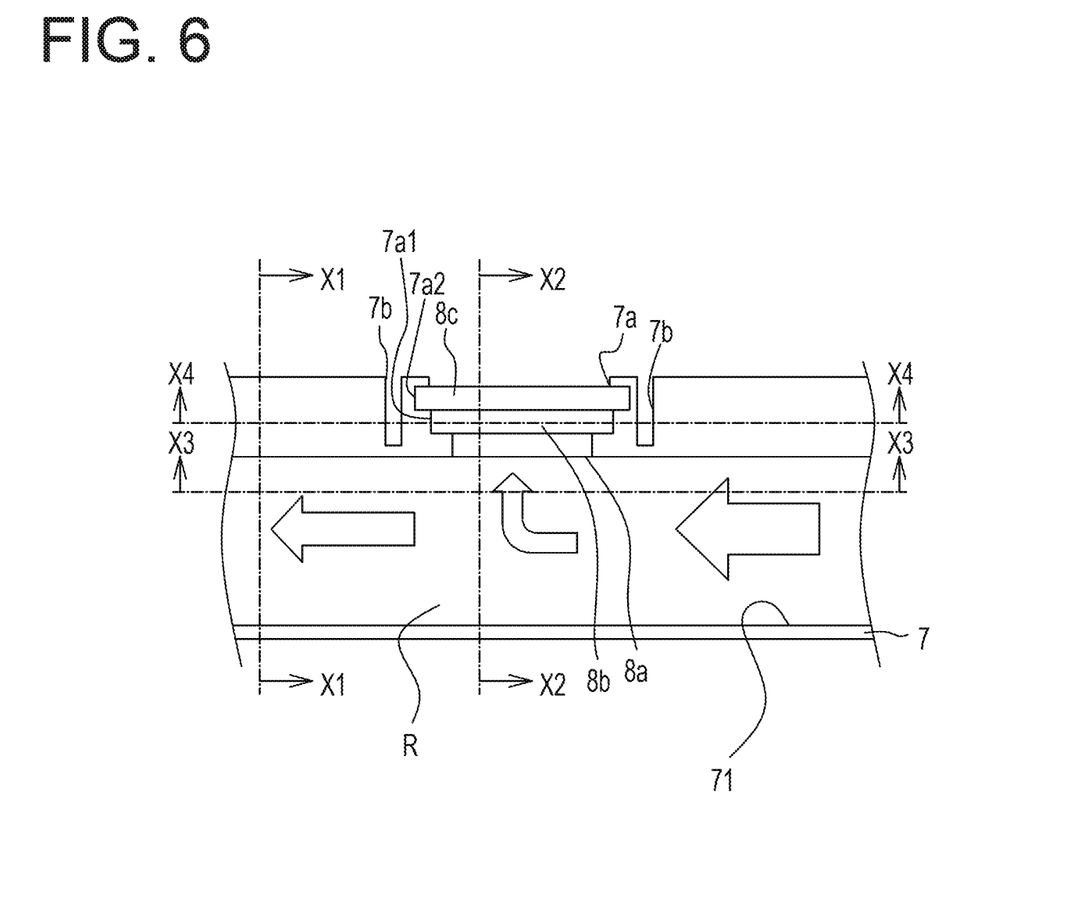
FIG. 6 is an explanatory view of a circumference of the gutter member and a flow rate adjusting gate provided in the liquid immersion tank of the embodiment when viewed from above.
Figure 7A:
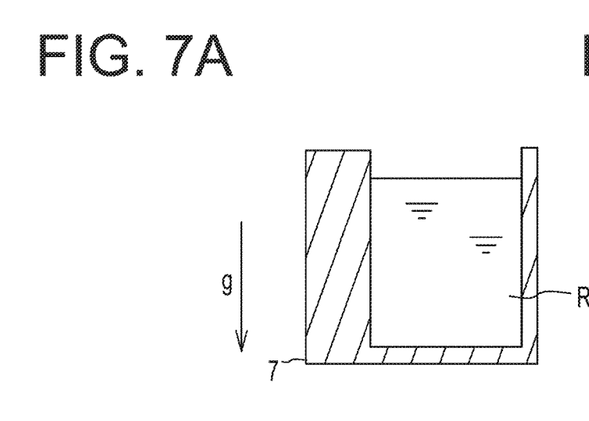
FIG. 7A is a cross-sectional view taken along a line X1-X1 in FIG. 6.
Figure 7B:
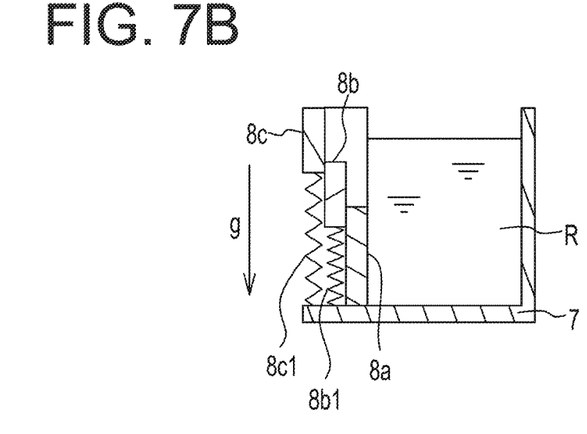
FIG. 7B is a cross-sectional view taken along a line X2-X2 in FIG. 6.
Figure 7C:
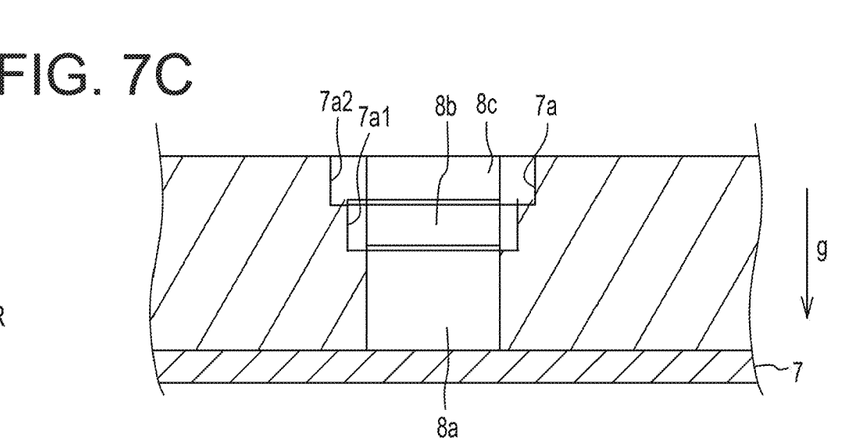
FIG. 7C is a cross-sectional view taken along a line X3-X3 in FIG. 6.
Figure 7D:
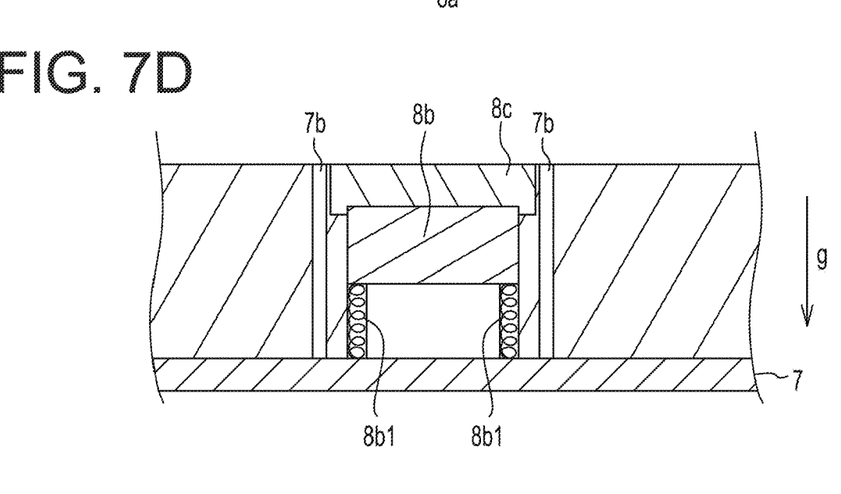
FIG. 7D is a cross-sectional view taken along a line X4-X4 in FIG. 6.
Figure 8A:
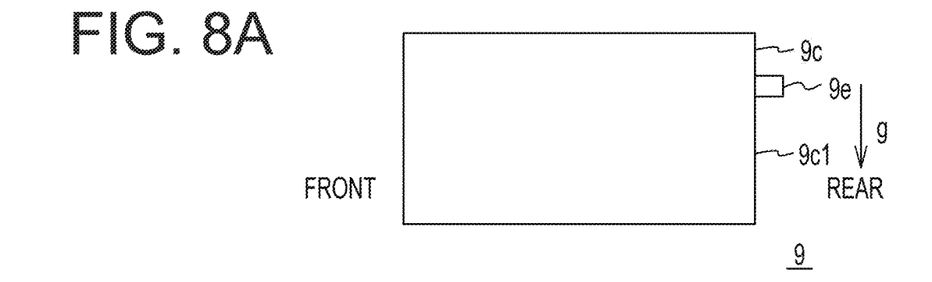
FIG. 8A is a side view of a down-flow block of the embodiment.
Figure 8B:
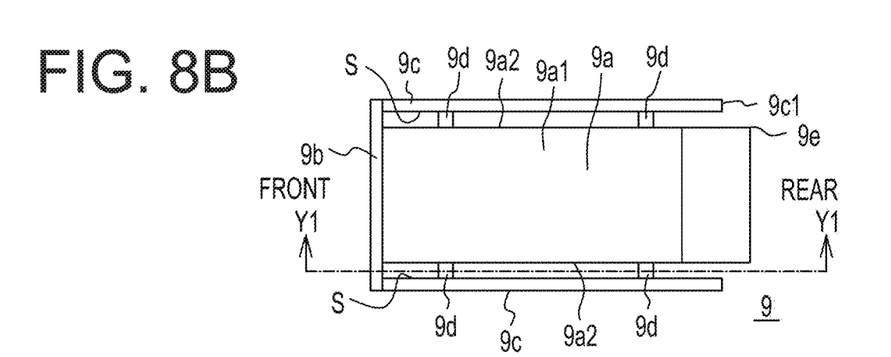
FIG. 8B is a plan view of the down-flow block of the embodiment.
Figure 8C:
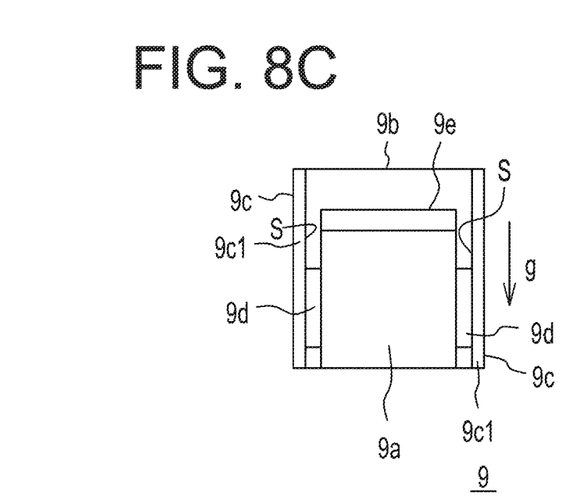
FIG. 8C is a rear view of the down-flow block of the embodiment.
Figure 8D:
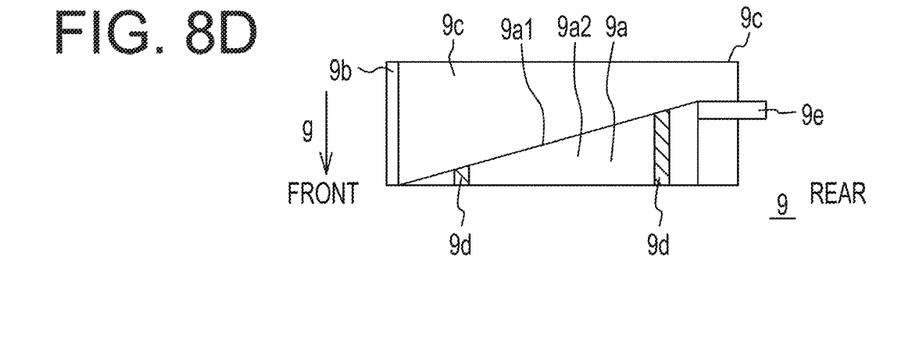
FIG. 8D is a cross-sectional view taken along a line Y1-Y1 in FIG. 8B.

The liquid immersion tank 1 includes a flow rate adjusting gate 8 provided at the outflow port 71 where the refrigerant R flows out from the flow path 71 provided at the gutter member 7. The flow rate adjusting gate 8 adjusts the outflow amount of the refrigerant. The liquid immersion tank 1 further includes a down-flow block 9 provided above the housing 100 and having a inclined surface 9*a*1 and a side surface 9*a*2 through which the refrigerant R branched from the flow path 71 through the flow rate adjusting gate 8 flows down toward the housing 100. The inclined surface 9*a*1 forms a downward inclination from the rear side to the front side. The flow rate adjusting gate is an example of a flow rate adjuster. The down-flow block is an example of a slope. The inclined surface 9*a*1 and the side surface 9*a*2 illustrated clearly in FIGS. 4 and 5 are included in a down-flow surface. The housing 100 is cooled by the refrigerant R that flows along the inclined surface 9*a*1 and the side surface 9*a*2. In FIG. 4, a front plate portion 9*b*, a side plate portion 9*c*, and a columnar portion 9*d* included in the down-flow block 9 are omitted for convenience of explanation. Further, in FIG. 5, the columnar portion 9*d* is omitted. The front plate portion 9*b*, the side plate portion 9*c*, and the columnar portion 9*d* will be detailed described later.

The liquid immersion tank 1 includes a lid 10 in order to suppress the refrigerant from being evaporated. The lid 10 closes a top opening of the outer tank 2 and the gutter member 7. In FIG. 1, the lid 10 is omitted.

In the embodiment, the refrigerant R is a fluorine-based refrigerant, for example, Fluorinert (registered trademark) available from 3M Company, or Novec (registered trademark) available from 3M Company. Asahi Klin (registered trademark) available from Asahi Glass Co., Ltd. (AGC) or Galden (registered trademark) available from SOLVAY Co., Ltd, or the like may also be used. In the embodiment, Fluorinert available from 3M Company is used. Fluorinert hardly forms water droplets, but easily flows along the inclined surface 9*a*1 and the side surface 9*a*2 as well as the side surface of the housing 100, because surface tension of Fluorinert is about one fifth of that of water. In other words, Fluorinert is formed in a film shape which makes it easy to flow, and has a high cooling effect. A silicone oil-based insulating refrigerant may be used. Examples of the silicone oil-based insulating refrigerant may include barrel silicone fluid available from Matsumura Oil Co., Ltd.

The refrigerant R pumped up by the pump 5 flows through the flow path 71 formed by the gutter member 7. An outflow port 7*a* for the refrigerant R is provided at the gutter member 7, and the refrigerant R branched from the flow path 71 flows down toward the housing 100 through the outflow port 7*a*. As a result, the housing 100 is cooled. An insertion groove used when the down-flow block 9 to be described later is attached is provided on each side of the outflow port 7*a*.

A plurality of outflow ports 7*a* are provided along a direction where the gutter member 7 extends on the front surface side of the gutter member 7 of the embodiment. The housing 100 is provided to be located at the lower side of the outflow port 7*a*.

The flow rate adjusting gate 8 is provided for each outflow port 7*a* to adjust the outflow amount of the refrigerant R. Here, the flow rate adjusting gate 8 will be described with reference to FIGS. 6 and 7A to 7D. The flow rate adjusting gate 8 of the embodiment includes a fixed weir 8*a*, a first movable weir 8*b*, and a second movable weir 8*c*. The fixed weir 8*a* extends upward from the bottom surface of the flow path 71. The reference symbol g in each drawing indicates the direction of gravity. This is also applied to each following drawing.

The first movable weir 8*b* is formed by a plate-like member, and is provided so as to be movable up and down at a first movable weir providing portion 7*a*1 provided at the outflow port 7*a*. The first movable weir 8*b* is biased in a closing direction, that is, upwardly, by a first spring 8*b*1. The first movable weir 8*b* is provided so as to block an area immediately above the fixed weir 8*a*. An upper edge of the first movable weir 8*b* has a height substantially equal to the upper edge of the fixed weir 8*a* when the first movable weir 8*b* is pressed most. The first spring 8*b*1 is an example of an elastic member.

The second movable weir 8*c* is formed by a plate-like member, and is provided so as to be movable up and down at a second movable weir providing portion 7*a*2 provided at the outflow port 7*a*. The second movable weir providing portion 7*a*2 is provided on the front side of the first movable weir providing portion 7*a*1. The second movable weir 8*c* is biased in a closing direction, that is, upwardly, by a second spring 8*c*1. The second movable weir 8*c* is provided so as to block an area immediately above the first movable weir 8*b* that is located on the uppermost side. An upper edge of the second movable weir 8*c* has a height substantially equal to the upper edge of the fixed weir 8*a* when the second movable weir 8*c* is pressed most. The second spring 8*c*1 is an example of an elastic member.

The outflow amount of the refrigerant R is adjusted according to the pressing amount of the flow rate adjusting gate 8, specifically, that of the first movable weir 8*b* and the second movable weir 8*c*. The first movable weir 8*b* and the second movable weir 8*c* are pressed in sequence. The second movable weir 8*c* is pressed prior to the first movable weir 8*b*. That is, the first movable weir 8*b* is pressed together with the second movable weir 8c after the second movable weir 8c is pressed until the upper edge thereof reaches the upper edge of the first movable weir 8b. When the second movable weir 8c is not pressed at all, the outflow port 7a is in a fully closed state. At this time, the refrigerant R does not flow out from the outflow port 7a. In other words, the water level of the refrigerant R flowing through the flow path 71 is set so as not to exceed the upper edge of the second movable weir 8c when the outflow port 7a is in the fully closed state.

In the embodiment, two movable weirs, that is, the first movable weir 8b and the second movable weir 8c are provided, but the number of the movable weirs is not limited thereto. The movable weir may be one plate-like member or a combination of three or more plate-like members.

Subsequently, the down-flow block 9 will be described with reference to FIGS. 8A to 8D and 9. The down-flow block 9 is detachably provided at the gutter member 7 in accordance with the position of the outflow port 7a. The down-flow block 9 includes an inclined portion 9a that includes the inclined surface 9a1 and the side surface 9a2 continued from the inclined surface 9a1. When the down-flow block 9 is in a state of being attached on the gutter member 7, the inclined surface 9a1 is inclined downward as a distance from the flow rate adjusting gate 8 increases. That is, in the embodiment, the inclined surface 9a1 is inclined downward from the rear side to the front side. The side surface 9a2 is continuous from the inclined surface 9a1 and guides the refrigerant R flowing down the inclined surface 9a1 to the housing 100.

The down-flow block 9 is provided with the front plate portion 9b at the front end portion of the inclined surface 9a1. Further, the down-flow block 9 includes the side plate portion 9c disposed to face the side surface 9a2. The side plate portion 9c is provided on each of the left side and the right side of the down-flow block 9. The columnar portion 9d is provided between the side surface 9a2 and the side plate portion 9c, and a gap S is formed between the side surface 9a2 and the side plate portion 9c. Since the front plate portion 9b is provided, the refrigerant R flowing down the inclined surface 9a1 does not flow down to the front surface side of the housing and is guided to both of the left side surface and the right side surface of the housing through the gap S.

In the embodiment, since the refrigerant R may be guided to the side surface of the housing 100 along the side surface 9a2, the side plate portion 9c is not necessarily required. However, by providing the side plate portion 9c, the refrigerant R becomes difficult to be scattered or the flow trajectory thereof becomes difficult to be separate from the side surface 9a2. Thus, the refrigerant R is efficiently guided to both of the left side surface and the right side surface of the housing. As a result, the cooling efficiency of the housing 100 is increased.

Further, the amount of the refrigerant R supplied to the side surface of the housing 100 may be adjusted by adjusting the dimension of the gap S.

In the housing 100, when a portion which requires to be cooled is one of the left side surface or the right side surface, the side plate portion 9c of the side surface side which does not require to be cooled may be provided integrally with the inclined portion 9a. That is, the cooling efficiency may be increased by preventing the refrigerant R from flowing down to the side surface side which does not require to be cooled, and actively flowing down the refrigerant R to the side which requires to be cooled.

The rear end portion of each of the left and right side plate portions 9c serves as an insertion portion 9c1. The insertion portion 9c1 is inserted into an insertion groove 7b provided at the gutter member 7 when the down-flow block 9 is attached to the gutter member 7.

Figure 9:
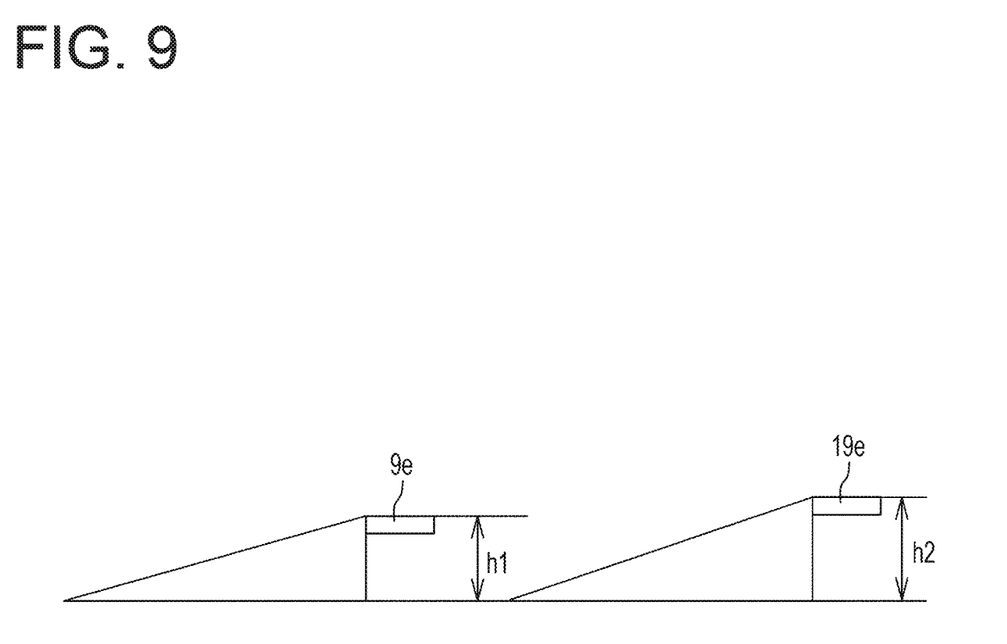
FIG. 9 is an explanatory view illustrating a height of the down-flow block of the embodiment.

The down-flow block 9 includes a pressing portion 9e at the rear end portion of the inclined portion 9a. The pressing portion 9e is provided to press the first movable weir 8b and the second movable weir 8c. Here, an installation height of the pressing portion will be described with reference to FIG. 9. The installation height of the pressing portion 9e of the down-flow block 9 illustrated in FIG. 9 is indicated by h1. Meanwhile, the installation height of a pressing portion 19e of the down-flow block 9 is indicated by h2. In this manner, the height of the pressing portion is set as necessary. The pressing amount of the first movable weir 8b and the second movable weir 8c is determined by the height h1 of the pressing portion 9e or the height h2 of the pressing portion 19e. The pressing amount of the first movable weir 8b and the second movable weir 8c determines the flow rate of the refrigerant R. The flow rate of the refrigerant R is set in advance to some extent that is necessary to cool the housing 100. Therefore, the height h1 of the pressing portion 9e and the height h2 of the pressing portion 19e are determined according to cooling capacity that is required for the housing 100. In this manner, the amount of the refrigerant R may be adjusted according to the amount of heat generated by the housing 100, that is, the housing 100 to be cooled.

In this manner, the installation height of the pressing portion is determined according to the amount of heat generated by the housing 100. Therefore, the down-flow block 9 prepared in a state where the installation height of the pressing portion is adjusted for each housing 100.

When the height of the pressing portion 9e is set to be low, the upper edges of the first movable weir 8b and the second movable weir 8c may be pressed to a lower position. Therefore, it is possible to increase the flow rate of the refrigerant R that passes through the outflow port 7a and is supplied to the housing 100. Conversely, when the height of the pressing portion 9e is set to be high, the upper edges of the first movable weir 8b and the second movable weir 8c are at a high position. Therefore, it is possible to decrease the flow rate of the refrigerant R that passes through the outflow port 7a and is supplied to the housing 100. The refrigerant R does not flow out from the outflow port 7a that is not provided with the down-flow block 9, because the first movable weir 8b and the second movable weir 8c are not pressed.

In this manner, according to the embodiment, the amount of the refrigerant R may be adjusted according to the amount of heat generated by the housing 100. Therefore, it is possible to suppress the total amount of the refrigerant R to be circulated. Further, since the embodiment is not a type where the refrigerant R is stored in the outer tank 2 and the housing 100 is immersed therein, it is possible to suppress the total amount of the refrigerant R. Therefore, it is possible to suppress the total weight of the liquid immersion tank 1. Further, suppressing the total amount of the refrigerant R is advantageous in cost.

First Modification

Figure 10A:
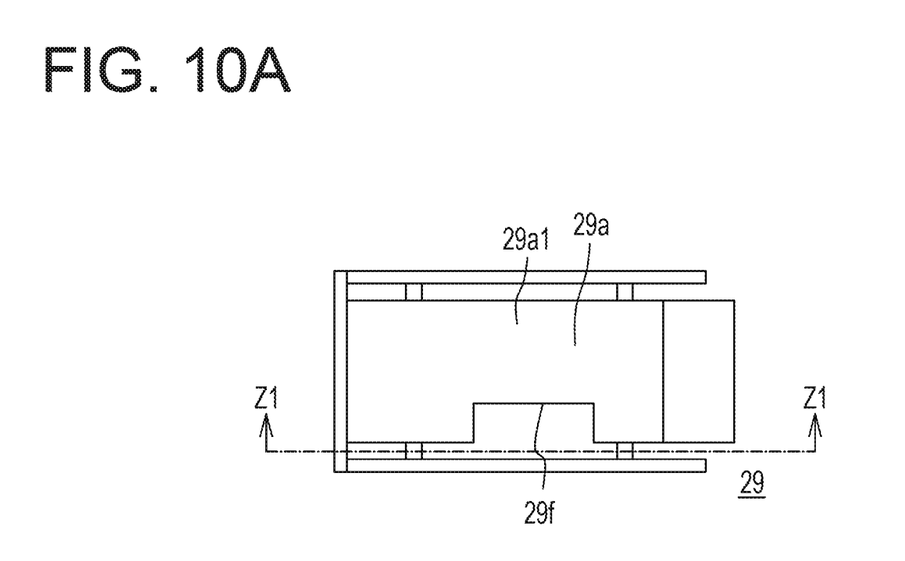
FIG. 10A is a plan view of a down-flow block of a modification.
Figure 10B:
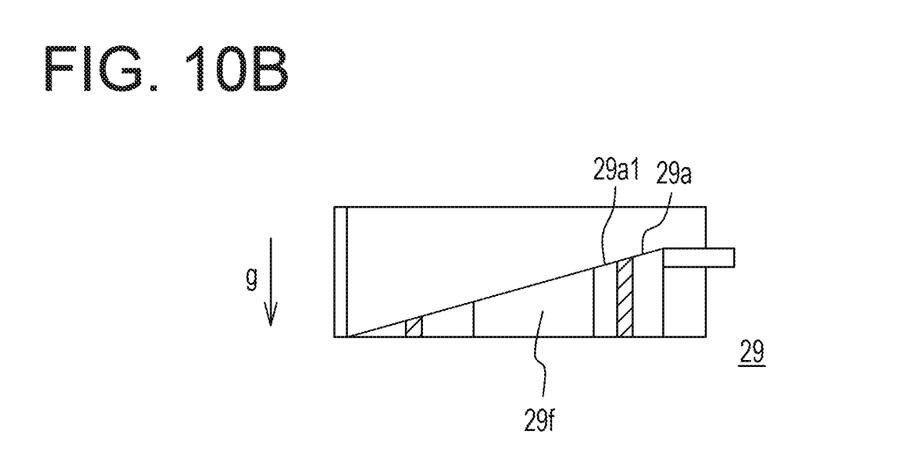
FIG. 10B is a cross-sectional view taken along a line Z1-Z1 in FIG. 10A.

Here, a first modification will be described with reference to FIGS. 10A and 10B. A down-flow block 29 of the first modification is provided with a notch portion 29f at an inclined surface 29a1 provided at an inclined portion 29a. The refrigerant R flows into the notch portion 29f. A large amount of the refrigerant R flows into the notch portion 29f as compared with other places of the inclined portion 29a, and a large amount of the refrigerant R is supplied to an area positioned at a lower side of the notch portion 29f. Therefore, the housing may be effectively cooled by providing the notch portion 29f to the housing, particularly to a place which requires to be cooled.

Second Modification

Figure 11:
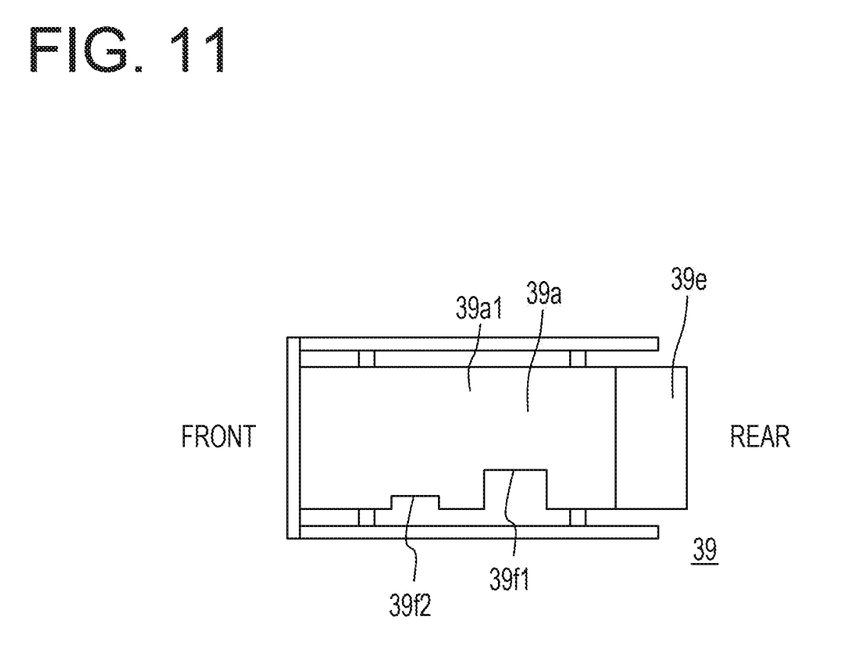
FIG. 11 is a plan view of a down-flow block of another modification.

Here, a second modification will be described with reference to FIG. 11. In a down-flow block 39 of the second modification 39, a plurality of notch portions are provided along a direction (front-rear direction) in which the down-flow block 39 extends starting from the flow rate adjusting gate side, that is, a pressing portion 39e. That is, the down-flow block 39 includes a notch portion 39f1 and a notch portion 39f2. As in the first modification, such notch portion 39f1 and notch portion 39f2 are provided to the housing, particularly to a place which requires to be cooled. Here, the notch portion 39f1 and the notch portion 39f2 are different in the notching amount with respect to an inclined surface 39a1. The notching amount of the notch portion 39f1 with respect to the inclined surface 39a1 is larger than that of the notch portion 39f2. This is because a place to be cooled positioned on a lower side of the notch portion 39f1 corresponds to a larger cooling requirement than a place to be cooled positioned on a lower side of the notch portion 39f2.

In this manner, the housing may be efficiently cooled by providing the notch portions in response to the cooling demand.

Third Modification

Figure 12:
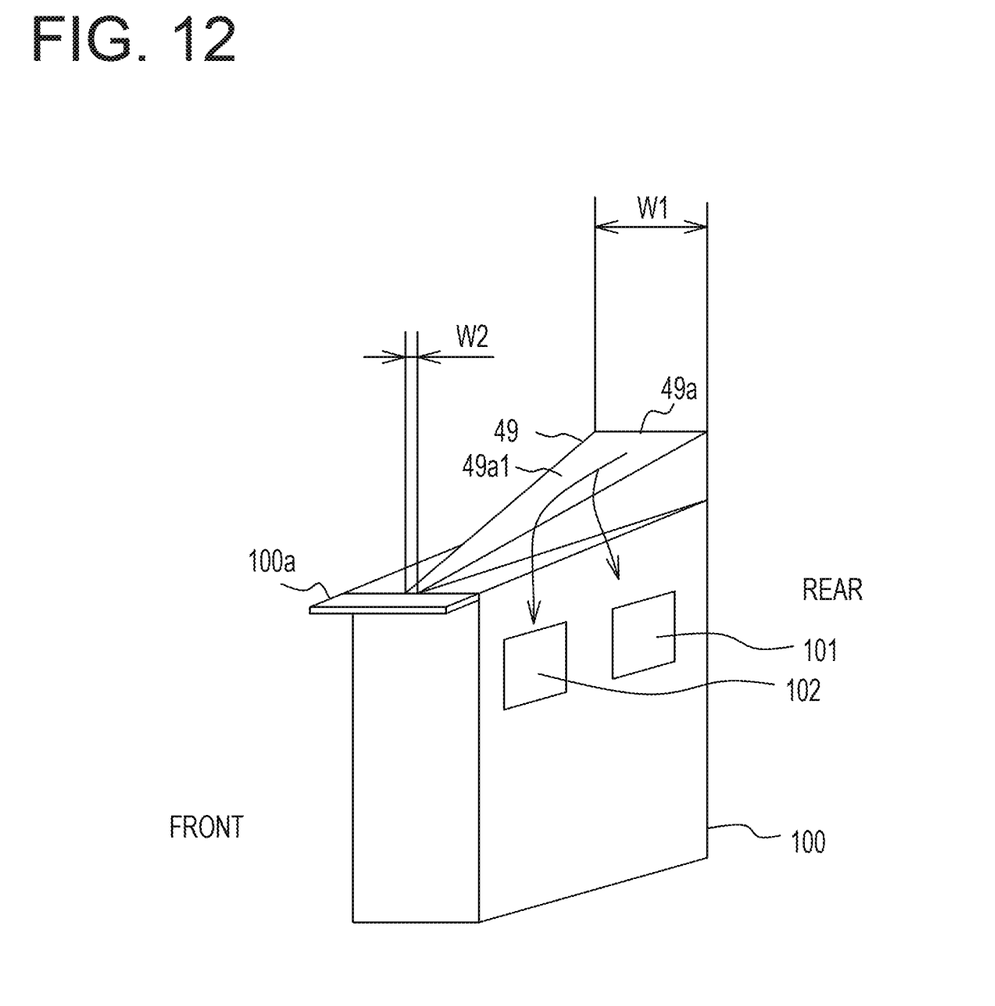
FIG. 12 is a perspective view illustrating a state where refrigerant flows down to a down-flow block included in the liquid immersion tank of still another modification.

Subsequently, a third modification will be described with reference to FIG. 12. In a down-flow block 49 of the third modification, a width of an inclined portion 49a is narrowed as a distance from the flow rate adjusting gate increases starting from the flow rate adjusting gate side (rear side), that is, as being close to the front side. The housing 100 is provided with a first electronic component 101 and a second electronic component 102. The second electronic component 102 is provided on the front side of the first electronic component 101. Here, the second electronic component is also a heat generating component, and the amount of heat generated by the second electronic component is larger than that of the first electronic component. Therefore, in the down-flow block 49, the width of the inclined portion 49a is narrowed as it goes toward the front side such that a large amount of the refrigerant R is supplied to the front side of the housing 100 in which the second electronic component 102 is provided.

In this manner, an appropriate amount of the refrigerant R may be supplied to a portion of the housing 100 by properly changing the width of the inclined portion 9a.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion tank comprising:
   a housing configured to house a heat generator;
   a gutter provided over the housing, and configured to form a flow path through which a coolant flows, the gutter includes a notch in a side wall;
   a flow rate adjusting gate provided at an outflow port through which the coolant flows out from the flow path, and configured to adjust an outflow amount of the coolant;
   a slope provided over the housing, and configured to include a down-flow surface through which the coolant branched from the flow path flows down toward the housing, the coolant flowing through the flow rate adjusting gate; and
   a tank configured to accommodate the housing.

2. The liquid immersion tank according to claim 1, wherein the down-flow surface includes:
   an inclined surface inclined downward as a distance from the flow rate adjusting gate increases, and
   a side surface continuous from the inclined surface so as to guide the coolant to flow down the inclined surface to the housing.

3. The liquid immersion tank according to claim 2, wherein the slope includes:
   a side plate portion disposed to face the side surface, and
   a gap formed between the side surface and the side plate portion.

4. The liquid immersion tank according to claim 1, wherein the flow rate adjusting gate includes:
   a movable weir provided to be movable up and down, and
   a spring that moves up the movable weir to be biased in a direction to close the outflow port.

5. The liquid immersion tank according to claim 4, wherein the slope includes a pressing portion configured to press the movable weir.

6. The liquid immersion tank according to claim 1, wherein the slope includes a notch into which the coolant flows, and the notch is provided on the down-flow surface.

7. The liquid immersion tank according to claim 6, wherein a plurality of notches including the notch is provided along a direction in which the slope extends starting from the flow rate adjusting gate.

8. The liquid immersion tank according to claim 1, wherein a width of the slope is narrowed as a distance from the flow rate adjusting gate increases starting from the flow rate adjusting gate.

* * * * *